(12) United States Patent
Arney et al.

(10) Patent No.: US 6,275,516 B1
(45) Date of Patent: Aug. 14, 2001

(54) ARTICLE FOR DETECTING POWER DRIFT IN THE PUTOUT OF A DIODE ARRAY SOURCE

(75) Inventors: Susanne Arney, Highland Park; Sandra Greenberg Kosinski, Murray Hill; Jane Deborah LeGrange, Princeton, all of NJ (US)

(73) Assignee: Agere Systems Optoelectronics Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/109,661

(22) Filed: Jul. 2, 1998

(51) Int. Cl.$^7$ ................................................. H01S 3/091
(52) U.S. Cl. ........................................................... 372/71
(58) Field of Search ........................ 372/71, 6, 9; 385/47, 385/48

(56) References Cited

U.S. PATENT DOCUMENTS

| | | | |
|---|---|---|---|
| 4,873,690 | * 10/1989 | Adams | 372/8 |
| 4,899,053 | * 2/1990 | Lai | 250/343 |
| 5,305,330 | * 4/1994 | Reider | 356/345 |
| 5,490,010 | * 2/1996 | Sharma | 359/341 |
| 5,504,762 | * 4/1996 | Hutchinson | 372/29 |
| 5,555,330 | * 9/1996 | Pan | 385/39 |
| 5,694,408 | * 12/1997 | Bott | 372/6 |
| 5,745,275 | * 4/1998 | Giles | 359/187 |
| 5,818,857 | * 10/1998 | Palmer | 372/32 |
| 5,847,816 | * 12/1998 | Zediker | 356/5.09 |
| 5,887,009 | * 3/1999 | Mandella | 372/6 |

OTHER PUBLICATIONS

Hashimoto et al, "Micro–Optical Gate for Fiber Optic Communication," Transducers '97: 1997 Int'1. Conf. Solid–State Sensors and Actuators, pp. 331–334, Chicago, Jun. 16–19, 1997.

* cited by examiner

Primary Examiner—Teresa M. Arroyo
Assistant Examiner—Gioacchino Inzirillo
(74) Attorney, Agent, or Firm—DeMont & Breyer, LLC; Wayne S. Breyer; Jason Paul DeMont

(57) ABSTRACT

A method and article for monitoring and controlling power drift in the output of a diode array is described. The diode array is used, for example, as a light pump for a fiber laser. In one embodiment, an improved fiber laser includes the light pump, which launches light into a laser cavity. The fiber laser further includes a sampler operable to receive at least a portion of the light before it is launched into the laser cavity. The sampled portion represents a known fraction of the total light signal generated by the light pump. In some embodiments, the sampled light is directed, via the sampler, to a photodetector. The photodetector converts the sampled light into a first electrical signal and delivers it to a processor. The processor is operable to compare the electrical signal with a set-point signal representative of a desired power output of the sampled portion of the launched light. To the extent that a differential exists between the set point signal and the first electrical signal, the desired optical power is not being launched into the lasing cavity. If such a differential exists, the processor generates and sends a control signal to a controllable current source. The control signal is operable to increase or decrease the current delivered from the controllable current source to the light pump to correct power drifts in light pump output.

11 Claims, 6 Drawing Sheets

ARTICLE FOR DETECTING POWER DRIFT IN THE PUTOUT OF A DIODE ARRAY SOURCE

FIELD OF THE INVENTION

The present invention relates generally to fiber lasers. More particularly, the present invention relates to an article for detecting and, optionally, correcting power drift in the output of a diode array source.

BACKGROUND OF THE INVENTION

Figure 1:
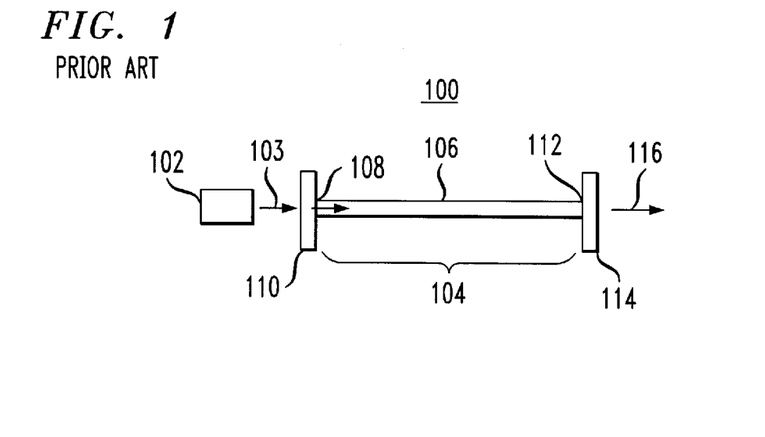
FIG. 1 depicts a simplified schematic of a conventional fiber laser.

FIG. 1 depicts a simplified schematic of a fiber laser 100. Fiber laser 100 includes a light pump 102, an optical fiber 106 and two reflectors, which, in fiber laser 100, are embodied as respective high-reflectivity and low-reflectivity mirrors 110 and 114. Mirrors 110 and 114 are disposed adjacent to respective fiber end faces 108 and 112, defining a laser cavity 104 therebetween. In other embodiments, the reflectors are implemented as gratings that are formed within the fiber 106. Light pump 102, advantageously a laser diode or diode array, launches light 103 (i.e., photons) into the laser cavity 104. The pump photons stimulate the emission of photons in the fiber 106 providing lasing output 116 at a characteristic wavelength, as described further below.

Figure 2:
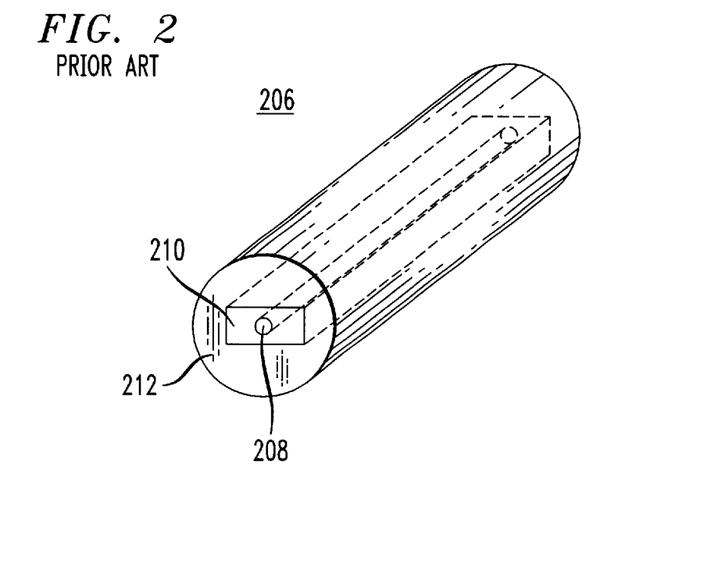
FIG. 2 depicts a conventional double-clad fiber suitable for use in the fiber laser of FIG. 1.

FIG. 2 shows a double-clad fiber 206 suitable for use as fiber 106 of fiber laser 100. Double-clad fiber 206 comprises single-mode fiber core 208, a multi-mode first cladding 210 surrounding fiber core 208, and a second cladding 212 surrounding first cladding 210. Light from light pump 102 is launched into first cladding 210. In some embodiments, light is launched into first cladding 210 at an end of fiber laser 100, known as "end-pumping," (see FIG. 1). In other embodiments (not shown), light from pump 102 is launched into first cladding through a side of fiber laser 100. In the embodiment depicted in FIG. 2, first cladding 210 has a rectangular cross section, wherein the ratio of the lengths of the long side to the short side is in the range from about 1.5/1 to about 10/1. In other embodiments, the first cladding has a "star" or "D-shaped" cross section. Typically, first cladding 210 comprises pure silica.

The geometry and refractive indices of fiber core 208, first cladding 210 and second cladding 212 are such that a substantial amount of light launched into first cladding 210 is coupled into fiber core 208. Such an arrangement is advantageous since light can be launched into multi-mode cladding, such as first cladding 210, without the high tolerances typically required for launching light directly into a single-mode core, such as fiber core 208.

Fiber core 208, typically 4–8 microns in diameter and comprising silica, is doped with one or more ionized rare-earth element ("active lasing element"), such as $Nd^{3+}$, $Yb^{3+}$, $Tm^{3+}$, and $Er^{3+}$. The active lasing element absorbs photons that are coupled into fiber core 208. Absorbing such photons increases the energy state of the active lasing element and causes "population inversion." As electrons in the active lasing element decay to lower energy states, photons are emitted that have a wavelength characteristic of the particular lasing element. In some embodiments, co-dopants, used for modifying the refractive index of the fiber core, are used in conjunction with the active lasing elements.

Second cladding 212 substantially prevents light from leaking from first cladding 210 to the outside environment. Such containment is accomplished by ensuring that the index of refraction of second cladding 212 is significantly lower than that of first cladding 210 (typically about 1.38 vs. 1.465). Second cladding 212, depicted in FIG. 2 as having a circular cross section, is suitably formed from a polymer, such as a fluoropolymer, or a low-index glass.

Figure 3:
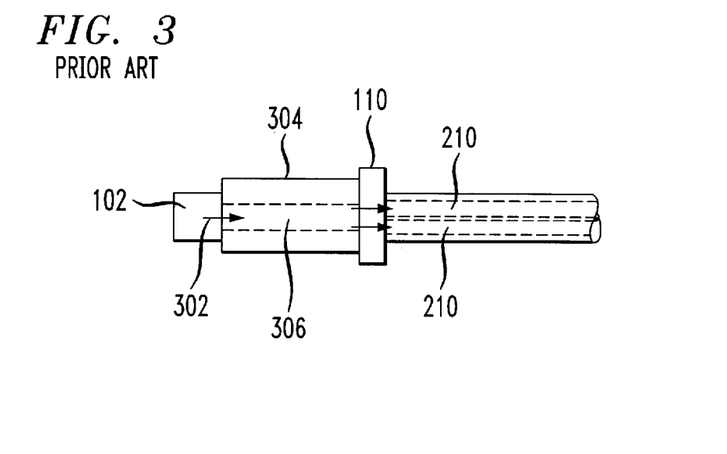
FIG. 3 depicts a conventional arrangement for launching light into a fiber laser.

FIG. 3 depicts additional details regarding the launching of light into fiber laser 100. In one embodiment, light pump 102 launches light 302 into a short connector-free section ("a pigtail") of multi-mode fiber 304 having multi-mode core 306. Fiber pigtail 302 is spliced to high reflector grating 110 and aligned to launch light 302 into first cladding 210.

It is desirable, if not critical, to be able to measure the power launched into a fiber laser in order to monitor and correct for drifts in the diode pump and to accurately test the laser output. Presently, no satisfactory method exists for performing such measurements. In one prior-art approach, a detector is located at the back facet of a diode. Such an approach does not, however, measure drifts in launched power. Rather, it measures the power generated at the source (i.e., the diode). Launched light cannot be measured in this manner because reflecting (back-propagating) the launched light for a measurement by the detector may damage the diode. Moreover, a multimode tap would be needed to route such back-propagating light to the detector. Such taps are not readily available. In another method, "integrating spheres" are used to detect light scattered from a fiber pigtail, such a fiber pigtail 302. Such detected light is disadvantageously not a measure of launch power. Furthermore, such integrating spheres are bulky.

As such, the art would benefit from a method and apparatus for accurately measuring the power launched into a fiber laser.

SUMMARY OF THE INVENTION

In some embodiments, an improved fiber laser incorporating feedback control in accordance with an illustrative embodiment of the present invention is disclosed. In one embodiment, the fiber laser includes a light pump, such as a laser diode or diode array, that launches light into a multi-mode fiber pigtail. The fiber pigtail is split into a first and a second section that are separated by a gap. The second portion of the fiber pigtail is attached to a first reflector, which is a high-reflectivity mirror or fiber grating. A double-clad optical fiber is disposed between the first reflectors and a second, relatively low reflectivity reflector.

The fiber laser further includes a sampler that is operable to sample at least a portion of the launched light traveling across the gap between the first and second portions of the multi-mode fiber pigtail. The sampled portion represents a known fraction of the total light signal launched into the first portion of the fiber pigtail.

In some embodiments, the sampled light is reflected, via the sampler, to a photodetector. The photodetector converts the sampled light into a first electrical signal and delivers it to a processor. The processor is operable to compare a value of the first electrical signal (e.g., voltage, etc.) to a set-point value indicative of a desired value for the electrical signal. The desired value is representative of a desired power of the sampled portion of the launched light. To the extent that a difference exists between the set point value and the value of the first electrical signal, the desired optical power is not being launched into the fiber laser. If such a difference exists, the processor generates and sends a control signal to a controllable current source. The control signal is operable to increase or decrease the current delivered from controllable current source to the light pump. Responsive to the control signal, the controllable current source thus delivers an appropriately-adjusted current to the light pump. In that manner, drifts in pump output are detected and corrected, thereby providing stable laser operation.

In other embodiments, the sampled light is absorbed by the sampler and a change in a property of the sampler due to such absorbed light is measured. The change in the property is correlated to the power of the absorbed light. The absorbed power is compared, using a processor, to an expected value of absorbed power for the quantity of absorbed light. If a differential exists, the processor generates and sends a control signal to a controllable current source as for the previously-described embodiment. Responsive to the control signal, the controllable current source delivers an appropriately-adjusted current to the light pump.

DETAILED DESCRIPTION

Figure 4:
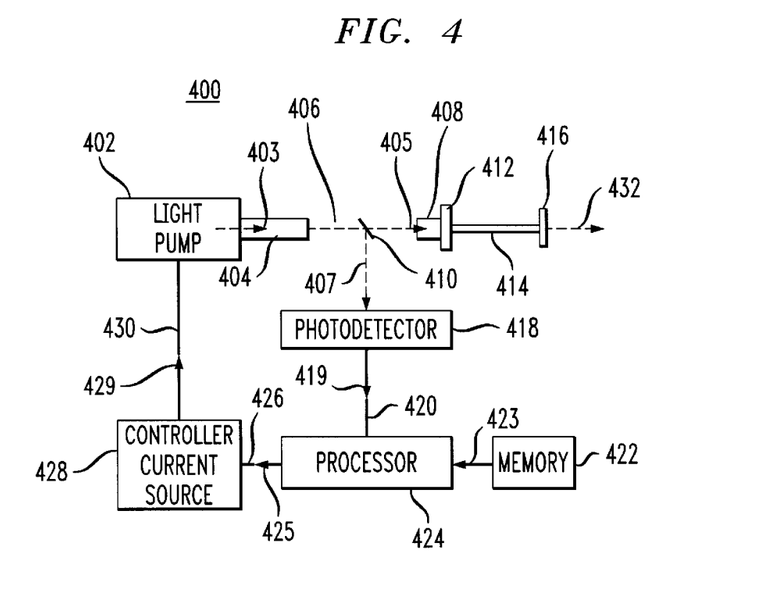
FIG. 4 depicts an improved fiber laser with feedback control.

FIG. 4 depicts an improved fiber laser 400 incorporating feedback control in accordance with an illustrative embodiment of the present invention. Improved fiber laser 400 includes light pump 402, which can be, without limitation, a laser diode or diode array. Light pump 402 launches light 403 into a first portion 404 of a multi-mode waveguide. In the illustrated embodiment, the waveguide is a fiber "pigtail." A gap 406 separates first portion 404 from a second portion 408 of the multi-mode fiber pigtail. Second portion 408 of multi-mode fiber pigtail is attached to high-reflectivity grating 412. Double-clad optical fiber 414 is disposed between high-reflectivity grating 412 and a lower reflectivity grating 416.

A sampler 410 is operable to receive and, in some embodiments, reflect at least a portion 407 of the light 403 traveling across gap 406 between respective portions 404 and 408 of the multi-mode fiber pigtail. The portion 407 represent a known fraction of the total light signal 403 propagating in first portion 404 of the fiber pigtail. Light 405 that is not reflected by sampler 410 is launched into the double-clad optical fiber 414 to stimulate lasing.

Light portion 407 is directed, via sampler 410, to a photodetector 418. Photodetector 418 can be any one of a number of devices including, without limitation, photodiodes, such as p-n, p-i-n and avalanche photodiodes, as well as heterojunction phototransistors and photoconductive detectors, to name a few. It is within the capabilities of those skilled in the art to suitably select a photodetector as a function of wavelength of the detected light and other factors. Photodetector 418 converts received light portion 407 into an electrical signal 419. Electrical signal 419 is representative of the power of received light portion 407. Electrical signal 419 is amplified (amplifier not shown) and delivered, via electrical connection 420, to processor 424.

Processor 424 compares electrical signal 419 (more accurately, a value indicative of a parameter such as amplitude, etc., of electrical signal 419) to a set-point value, embodied as signal 423, advantageously retrieved from a processor-addressable memory 422. The set-point value is indirectly representative of a desired power level of launched light signal 403. In other words, the known fraction of light power removed from launched light signal 403 by sampler 410, and the desired quantity of launched light power dictates a particular value (e.g., voltage, etc.) for an electrical signal generated by the photodetector. To the extent that a differential exists between the set point value and the signal 419, the desired optical power is not being launched into fiber laser 400. If such a differential exists, processor 424 generates and sends a control signal 425, via connection 426, to a controllable current source 428. Control signal 425 is operable to increase or decrease the current delivered from controllable current source 428. Responsive to control signal 425, controllable current source 428 delivers an appropriately-adjusted current to light pump 402 via connection 430. Lasing output 432 is generated by fiber laser 400 according to well-known principles.

In accordance with the present teachings, sampler 410 may be suitably embodied in numerous ways to accomplish its function of intercepting light portion 407 for delivery to photodetector 418. Common to such numerous embodiments is an ability of sampler 410 to withstand thermal effects, since the sampler is advantageously designed to be used in conjunction with high power fiber lasers (lasing output ~10–20 watt cw), as well as low power fiber lasers (lasing output: milliwatt range). In particular, regarding high power applications, sampler 410 must possess a high degree of absolute temperature stability, be sufficiently robust to withstand residual stresses and thermal mismatch between component materials, and possess long term stability in the face of repetitive temperature cycling.

Illustrative embodiments of sampler 410 presented herein fall into one of two categories. One category includes those devices that are situated permanently in the path of the launched optical signal 403 in gap 406, hereinafter "category I sampler." Some of the devices in this category are located partially within gap 406, and others are located fully with gap 406. Such devices must be physically adapted for dissipating heat, especially in high power applications. The second category of devices includes those that are periodically introduced into gap 406 to intercept launched optical signal 403 and are then rapidly removed from the gap, hereinafter "category II devices." Although exposed to the heat flux of launched optical signal 403 for only a short period of time, category II devices must nevertheless possess the ability to dissipate the amount of heat absorbed during the sampling operation. Moreover, category II devices must have a response time suitable for meeting the requirements of the sampling schedule. The sampling schedule can vary widely from application to application as a function of the drift rate of the diode array, which, for a given diode array, is a known or readily measurable quantity. Drift rates on the order of seconds, minutes or hours are typical. The response time of a category II device is orders of magnitude faster than even the fastest of such drift rates.

A second, more problematic constraint on device response time must also be considered. In particular, device response time must be faster than the excited state lifetime of the particular lasing element (e.g., $Nd^{3+}$, $Yb^{3+}$, $Tm^{3+}$, and $Er^{3+}$). For example, the $Yb^{3+}$ excited-state lifetime, which is among the shortest lifetime of the listed lasing elements, may be on the order of micro seconds in the laser configuration. Some actuators suitable for moving category II samplers into and out of the optical path have a response time on the order of about 50 milliseconds. Such a response time is expected to be unacceptably slow for use with a $Yb^{3+}$ fiber laser. Disruption of pump light for such a "long" period of time could result in loss of lasing activity. Thus, for a $Yb^{3+}$ fiber laser, a category I sampler is more suitably used. Alternatively, if category II samplers are used, they should intercept only a portion of the pump light being directed towards the laser cavity.

In some embodiments, the present invention is used for simply measuring the output of a diode array source. In such embodiments, lasing action is not being generated. As such, the excited state lifetime of the lasing element does not constrain sampler selection. In other words, since there is no reason to launch light into the lasing cavity, the full output of the pump may be sampled.

Several illustrative embodiments of a sampler suitable for use in conjunction with the present invention are now described below and depicted in FIGS. 5–13.

Figure 5:
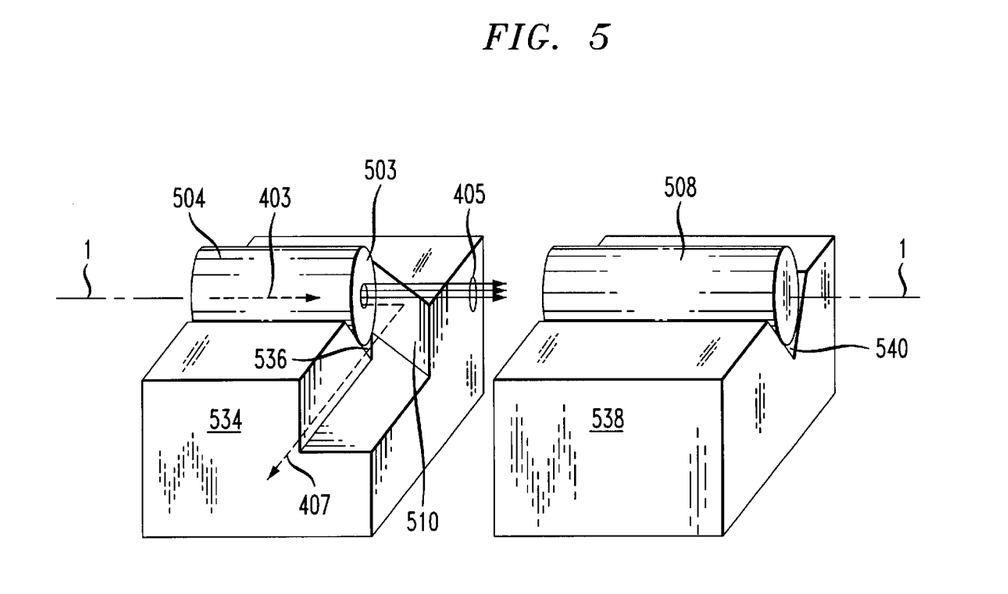
FIG. 5 depicts a first embodiment of a fixed sampler for sampling launched light.
Figure 6:
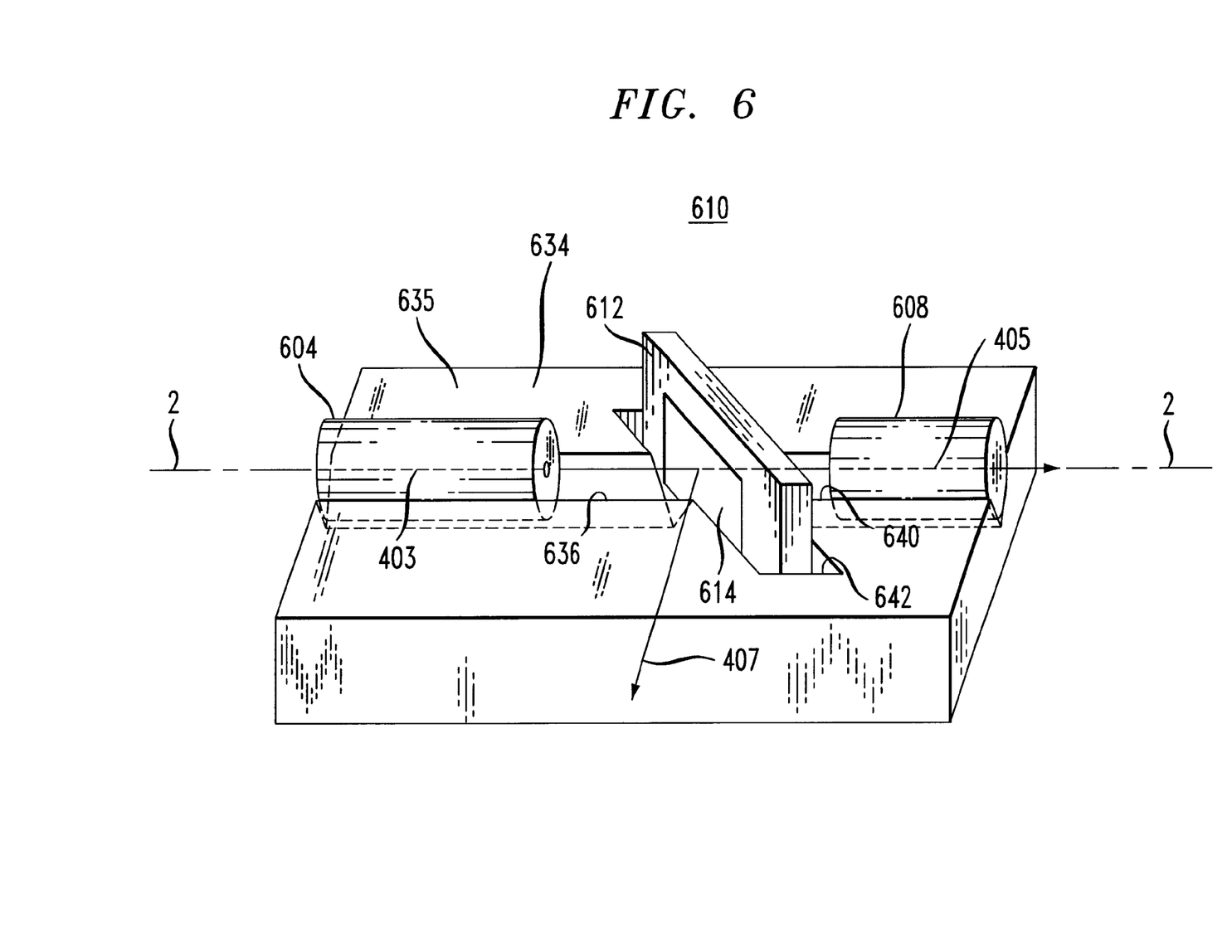
FIG. 6 depicts a second embodiment of a fixed sampler for sampling launched light.

FIGS. 5 & 6, described below, depict a first and second embodiment of category I devices (i.e., samplers permanently in the optical path). More particularly, FIG. 5 depicts a first illustrative embodiment wherein a sampler 510 is a fixed reflectivity device. FIG. 5 depicts two supports 534 and 538. Such supports receive first and second multi-mode fiber pigtails 504 and 508 in respective guides 536 and 540. Such guides may be configured as v-grooves, rails, channels or the like as is suitable for aligning the fiber pigtails. Sampler 510 is positioned to intercept portion 407 of launched light 403.

In the present embodiment, sampler 510 is simply an "angled," reflective surface. Sampler 510 is described as "angled" because it is disposed at an oblique angle with respect to optical axis 1-1. Such an angled disposition allows the sampler to redirect intercepted light away from optical axis 1-1 towards a photodetector (not shown in FIG. 5; see FIG. 4). For example, in one embodiment, sampler 510 is disposed at a 45 degree angle relative to optical axis 1-1. As a result, intercepted light portion 407 is reflected from sampler 510 along a path that is orthogonal to optical axis 1-1. The path of intercepted light portion 407 can be predictably changed by orienting sampler 510 at a different angle relative to optical axis 1-1. Sampler 510 is advantageously micro-machined by known methods or otherwise integrated into support 534. Sampler 510 is advantageously coated to enhance reflectivity, such as with a metal (e.g., gold, etc.), a dielectric coating, or a polymer multi-layer comprised of layers of one or more polymers having differing refractive indices in the manner of a dielectric mirror.

As a category I device, sampler 510 is permanently in the optical path of launched light 403. As such, it must be positioned relative to the first fiber pigtail 504 such that it intercepts only a portion (i.e., the portion 407) of launched light 403, allowing a greater portion (i.e., portion 405) to be received by second fiber pigtail 508 and ultimately launched into the laser cavity (not shown in FIG. 5; see FIG. 4). Those skilled in the art can readily micro-machine the groove 536 and sampler 510, as a function of cladding and core size, to intercept a desired portion of launched light 403.

Since light exposure is constant for category I devices, sampler 510 is not exposed to temperature cycling and to the concomitant thermal stresses. Category I devices are, however, constantly exposed to heat from the intercepted light portion 407. Such devices advantageously include structural adaptions for the removal of such heat, especially in high power applications. In the present embodiment, substrate 534 advantageously functions as a heat sink to dissipate heat from sampler 510. As such, substrate 534 advantageously comprises a material or materials possessing relatively high thermal conductivity. Illustrative suitable materials include, without limitation, metals, dielectrics, some polymers, silicon and silicon dioxide. Those skilled in the art can readily identify suitable polymers by consulting reference texts such as, for example, Brandup and lmmerguts' *Polymer Handbook*, (John Wiley & Son, 3d. ed. 1989).

In FIG. 5, fiber pigtails 504 and 508 are depicted as being disposed on different supports (i.e., supports 534 and 538), with a relatively large gap therebetween for clarity of illustration. While the present embodiment can be implemented in such a manner, it is advantageous for fiber pigtails 504 and 508 to be located on a single substrate with a gap no larger than is required to accommodate sampler 510. Such an approach simplifies manufacture, reduces cost and decreases insertion losses. With regard to FIG. 5, such a single substrate may envisioned by "sliding" (conceptually) support 538 to the left until it abuts support 534. Other implementations similar in configuration to the present embodiment wherein a fixed reflective surface is permanently positioned within the optical path of launched light 403, as will occur to those skilled in the art in view of the present teachings, fall within the contemplated scope of the present invention.

In the embodiment depicted in FIG. 5, as well as in all other illustrative embodiments described in this specification, opposed ends of the first and second fiber pigtails are advantageously angle cleaved to prevent back reflection. Note that in the embodiment depicted in FIG. 5, as well as in all other illustrative embodiments described herein, the first and second fiber pigtails are depicted as being coaxial. It should be appreciated that in other embodiments, the first and second fiber pigtails are not coaxial. Rather, the first fiber pigtail and the sampler are coaxial, with the second fiber pigtail being disposed at an oblique angle thereto. In such a case, the amount of the launched light being re-directed from the optical axis of the first fiber pigtail by the sampler (towards the second fiber pigtail) may be significantly greater than the light be re-directed by the sampler (towards the photodetector) in the embodiment of FIG. 5.

FIG. 6 depicts a second illustrative embodiment wherein a sampler 610 comprises a variable-reflectivity device. In one embodiment, sampler 610 advantageously includes an optical subassembly 612 that supports variable reflectivity device 614 in an upright position orthogonal to the surface 635 of support 634. As in the previous embodiment, sampler 610 is disposed at an oblique angle to optical axis 2-2 so that intercepted light portion 407 is directed away from the optical axis to a photodetector (not shown). Sampler 610 is disposed in recess 642 between first and second multi-mode fiber pigtails 604 and 608. Fiber pigtails 604 and 608 reside in respective guides 636 and 640.

In operation, variable-reflectivity device 614 is advantageously placed in one of two states. In a first state, variable-reflectivity device 614 is substantially transmissive such that substantially all of launched light 403 passes through the variable-reflectivity device and into second fiber pigtail 608. In a second state, variable-reflectivity device 614 is at least partially reflective, such that light portion 407 is reflected away from the variable-reflectivity device 614 towards a photodetector (not shown). The variable reflectivity device is thus placed in the second state to monitor launched light 403 and adjust, as necessary, the output of light pump 402 (FIG. 4).

Transmissivity should be as high as possible in the first state. To the extent that any of launched light 403 is reflected when variable-reflectivity device 614 is in the first state, such reflected light represents a decrease in laser output.

Illustrative variable-reflectivity devices include, for example, semiconductor or micro-mechanical optical modulators, both of which are well known in the art. For examples of micro-mechanical modulators, see U.S. Pat. Nos. 5,500,761; 5,654,819; 5,589,974 and assignee's U.S. Pat. Apps. Ser. Nos.: 08/565,453 filed Feb. 1, 1996 (now allowed), and 08/901,050, filed Aug. 25, 1997; see also, Marxer et al., "MHz Opto-Mechanical Modulator," Transducers '95—Eurosensors IX, Royal Swedish Academy of Eng. Sciences, Stockholm (June 1995), pp. 289–292. The aforementioned patents, patent applications and publication are incorporated by reference herein.

The aforementioned micro-mechanical optical modulators typically comprise a movable layer, often polysilicon or silicon nitride, suspended over a non-moving substrate, usually silicon. In some embodiments, the presence of a silicon substrate in variable-reflectivity device 614 will disadvantageously compromise its ability to achieve high transmittance. In particular, in such embodiments, silicon absorbs light over the operating wavelength range of light pump 402 (FIG. 4). Thus, in one embodiment, variable-reflectivity device 614 is advantageously modified such that a portion of its silicon substrate is removed to provide unimpeded transmission of launched light. Such removal may be accomplished, for example, by a potassium hydroxide (KOH) backside etch. In other embodiments, variable reflectivity device 614 is fabricated on a substrate, such as quartz, that does not absorb light in the relevant wavelength ranges, for example, at 915 nm.

FIGS. 7, 8 and 11–13 depict several illustrative embodiments of category II samplers (i.e, samplers that are only temporarily in the optical path). Such samplers generally comprise a reflective surface linked to an actuator suitable for rapidly moving the reflective surface into and out of the path of the launched light 403 to obtain a grab sample (i.e., light portion 407).

In the illustrative embodiments, the actuators advantageously utilize micro electro-mechanical systems ("MEMS") technology. MEMS technology is capable of producing actuators having dimensions on the order of tens of microns. Such microactuators are fast, with response times in the range of nanoseconds to milliseconds depending upon microactuator design, have low power consumption, and are suitably-sized for optical applications. Technology for fabricating MEMS devices is available from many sources, such as, for example, the MEMS Technology Application Center at North Carolina (generally referred to as "MCNC," which is an acronym for "Microelectronics Center of North Carolina"). One of the MEMS technologies offered by MCNC is a three-polysilicon-layer surface-micromachining process. The lowest polysilicon layer, POLY0, is non-releasable and is used for patterning address electrodes and local wiring on a substrate, such as a silicon wafer or chip. The upper two polysilicon layers, POLY1 and POLY2 are releasable to form mechanical structures. Such release is achieved by etching away sacrificial oxide layers deposited between the polysilicon layers during fabrication. The polysilicon and oxide layers are individually patterned, and unwanted material from each layer is removed by reactive ion etching before the next layer is added.

For additional detail concerning the fabrication, assembly and use of MEMS devices, See, Pister et al., "Microfabricated Hinges," vol. 33, Sensors and Actuators A, pp. 249–56, 1992; and Hashimoto et al., "Micro-Optical Gate for Fiber Optic Communication," Transducers '97—1997 Int'l Conf. Solid-State Sensors and Actuators, Chicago, Jun. 16–19, 1997, pp. 331–334, both of which are incorporated by reference herein; see also assignee's co-pending patent applications MICRO MACHINED OPTICAL SWITCH, filed May 15, 1997 as Ser. No. 08/856569; METHODS AND APPARATUS FOR MAKING A MICRODEVICE, filed May 15, 1997 as Serial No. 08/856565; SELF-ASSEMBLING MICROMECHANICAL DEVICE, filed Dec. 22, 1997 as Ser. No. 08/997175, and MICROMECHANICAL XYZ STAGE FOR USE WITH OPTICAL ELEMENTS, filed Sep. 23, 1997 as Ser. No. 08/935,971, all of which applications are incorporated by reference herein.

Figure 7:
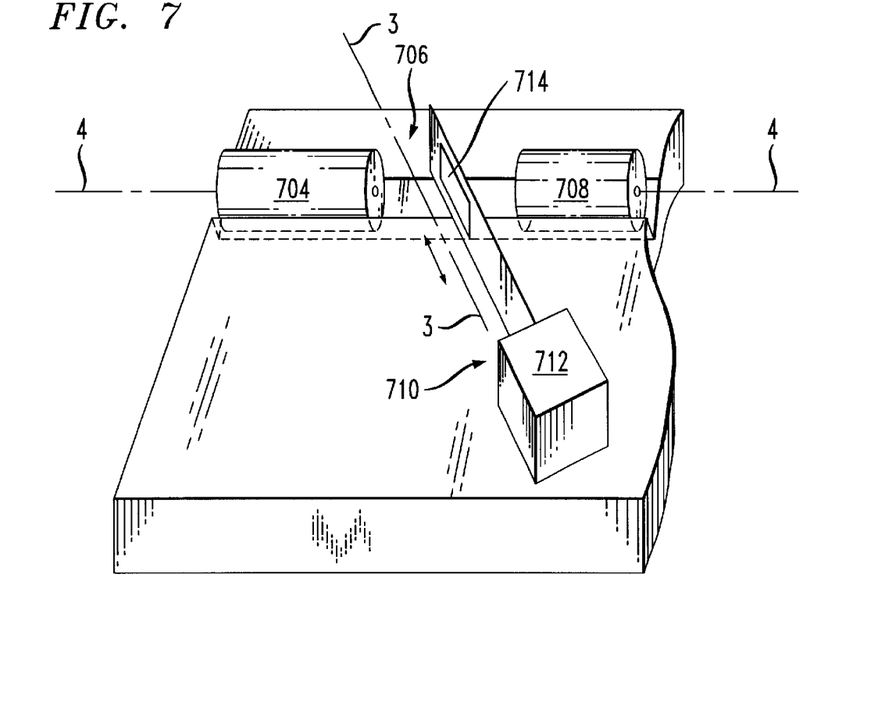
FIG. 7 depicts a first embodiment of a movable sampler for sampling launched light.

FIG. 7 depicts, figuratively, a sampler 710 for use in conjunction with the present invention. Sampler 710 comprises an actuator 712 suitable for moving linked reflective surface 714 into and out of gap 706 between first and second multi-mode fiber pigtails 704 and 708. Actuator 712 provides "in-plane" actuation, moving reflective surface 714 in a substantially horizontal reciprocating manner parallel to axis 3-3 and at an oblique angle to optical axis 4-4.

Figure 8:
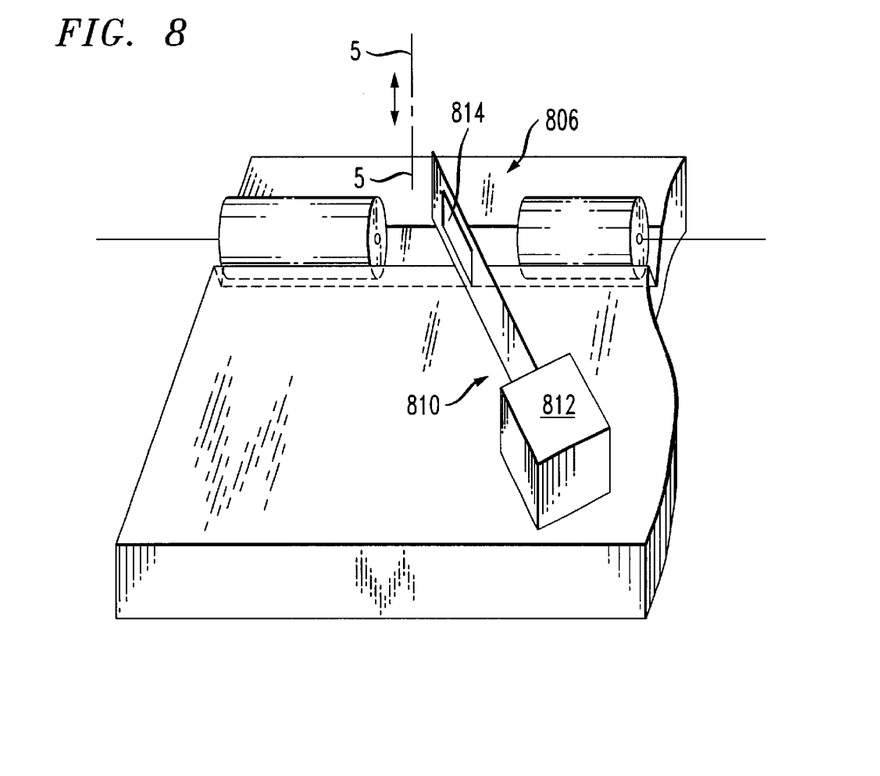
FIG. 8 depicts a second embodiment of a movable sampler for sampling launched light.
Figure 9:
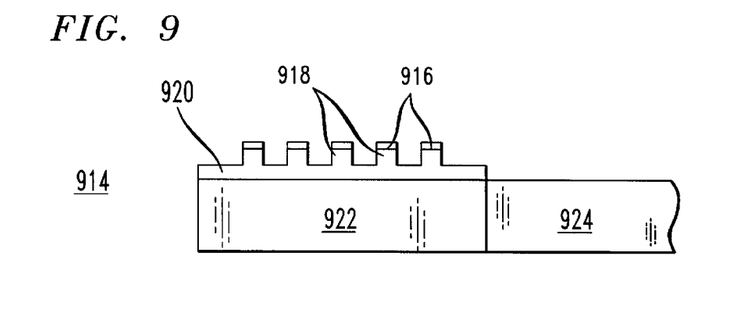
FIG. 9 depicts a first alternate embodiment of a moderate reflectivity surface.

FIG. 8 is a figurative depiction of a sampler 810. Like sampler 710, sampler 810 comprises an actuator 812 suitable for moving linked reflective surface 814 into and out of gap 806 between first and second multi-mode fiber pigtails 804 and 808. Unlike actuator 712, actuator 812 provides "out-of-plane" actuation, moving reflective surface 814 in a substantially vertically reciprocating manner, parallel to axis 5-5.

Illustrative implementations of actuators 712 and 812 are provided in Ser. No. 08/856569, cited above. It should be understood that a variety of other implementations of actuators suitable for providing the requisite actuation may suitably used.

In the embodiments shown in FIGS. 7 and 8 (and those depicted in FIGS. 5 and 6, previously described), the first and second multi-mode fiber pigtails and actuator/linked reflective surface (FIGS. 7 and 8 only) are advantageously aligned using guides (not shown for the actuator/linked reflective surface) that are fabricated contemporaneously with the actuator. In one embodiment, such guides are polysilicon "rails" that are patterned using any of a variety of MEMS-type multi-level polysilicon technology. Alternatively, the traditional v-groove or channel may be used for such purpose.

In some embodiments, such as the illustrative embodiments depicted in FIGS. 7 and 8, the linked reflective surface (714, 814) comprises a high reflectivity coating (e.g., metal) uniformly deposited by known methods on a suitably-sized support that is mechanically linked to the actuator (712, 812). In a first alternate embodiment depicted in cross section in FIG. 9, linked reflective surface 914 comprises a reflective coating 916 that is deposited on ribs 918 that are patterned in a transparent (at the operating wavelengths) thin film 920 having relatively high thermal conductivity. Materials suitable for forming thin film 920 include, without limitation, a thermally-conductive and transparent polymer, silicon oxide, silicon dioxide, silicon nitride. Thin film 920 is disposed on transparent substrate or support 922, such as quartz, and, depending on operating wavelengths, silicon and gallium arsenide, that is mechanically linked, via linkage 924, to an actuator (not shown).

Figure 10:
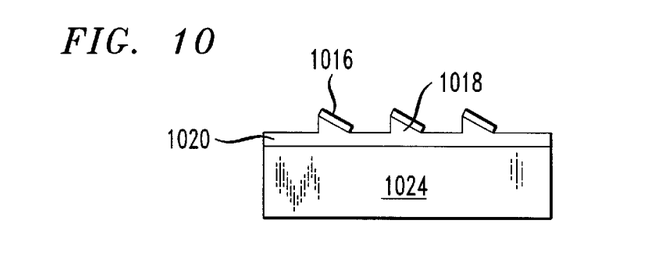
FIG. 10 depicts a second alternate embodiment of a moderate reflectivity surface.

In a second alternative embodiment depicted in cross section in FIG. 10, linked reflective surface 1014 comprises a reflective coating 1016 that is disposed on "textured" reflectors 1018 that are patterned in a transparent thin film 1020, which thin film is suitably selected from thermally-conductive and transparent polymers, silicon oxide, silicon dioxide, silicon nitride and the like, as for thin film 920. Thin film 1020 is disposed on transparent substrate or support 1024 that is linked to an actuator (not shown). Surface 1022 of each textured reflector 1018 is disposed at an oblique angle to optical axis 7-7. As such, launched light defining an optical path orthogonal to thin film 1020 and support 1024 of linked reflective surface 1014 is reflected away from optical axis 7-7 to a desired destination (i.e., a photodetector), via textured reflectors 1018. Thus, in embodiments wherein such textured reflectors are used, linked reflective surface 1014 (i.e., support 1024) is advantageously positioned orthogonal to optical axis 7-7, rather than at an oblique angle thereto, as in the other illustrative embodiments. Since support 1024 is disposed orthogonal to optical axis 7-7, it can be accommodated in a relatively smaller gap between the fiber pigtails. Textured reflectors 1018 can be fabricated by known processes such as angle evaporation or stepped deposition. Linked reflective surfaces 914 and 1014 tend to have lower reflectivity than reflective surfaces 714 or 814, since, for the latter reflective surfaces, a high-reflectivity coating is uniformly applied to a support.

Figure 11:
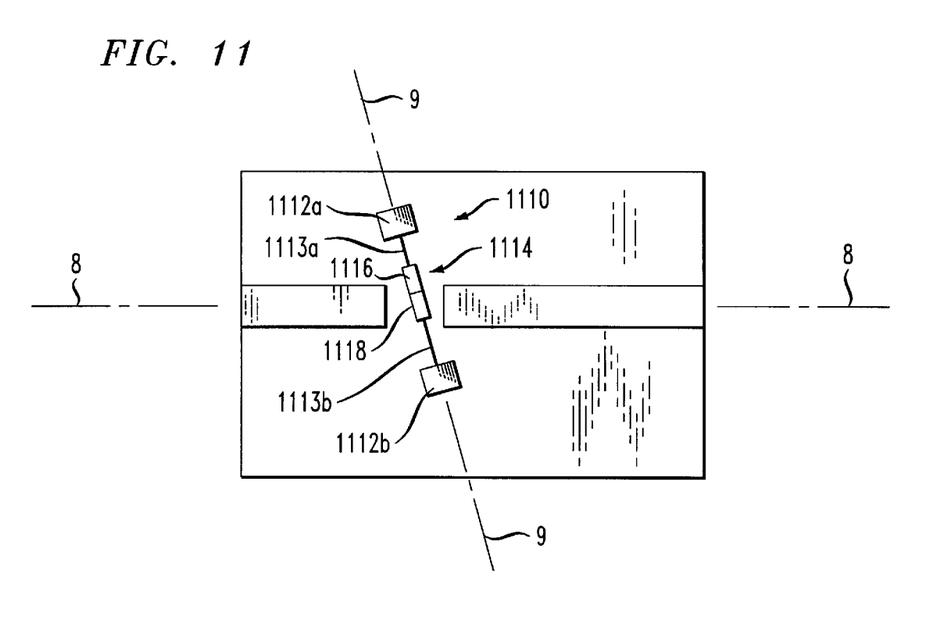
FIG. 11 depicts a third embodiment of a movable sampler for sampling launched light.

FIG. 11 depicts a top view of an alternative embodiment of a sampler 1110 in accordance with the present teachings. Sampler 1110 comprises frame 1114, which is linked, via linkages 1113a and 1113b, to respective dual actuators 1112a and 1112b. Frame 1114 is disposed at an oblique angle to optical axis 8-8. Frame 1114 comprises an at least partially reflective portion 1116 and a substantially transmissive portion 1118. Actuators 1112a and 1112b are operable to move frame 1114 in "push-pull" fashion parallel to axis 9-9. In doing so, one or the other of portions 1116 or 1118 of frame 1114 is moved into optical axis 8-8 in the path of the launched light In particular, to sample the launched light, partially reflective portion 1116 is moved into the light path; otherwise, substantially transmissive portion 1118 is in the optical path of the launched light.

Figure 12:
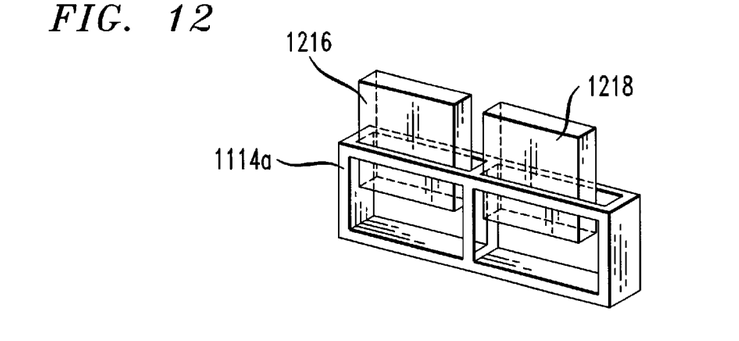
FIG. 12 depicts an embodiment of a frame for use with the movable sampler depicted in FIG. 11.

FIG. 12 depicts a first specific illustrative implementation of frame 1114 of FIG. 11. In particular, FIG. 12 depicts frame 1114a having an at least partially-reflective insert 1216 and a substantially-transparent insert 1218. In one embodiment, insert 1216 is a high-reflectivity mirror having a reflectivity in the range of about 75+percent, and insert 1218 is a substantially-transparent material (at the relevant wavelengths). The high reflectivity mirror can be, without limitation, a dielectric mirror or metal-coated support. The substantially-transparent material can be, without limitation, quartz or other materials as a function of the wavelength of the pump light. For example, if the wavelength is greater than about 1 micron, then silicon can be used. Substantially-transparent portion 1118 can of course be implemented by keeping the appropriate portion of frame 1114a empty (i.e., not inserting the insert 1218). In another embodiment, insert 1216 has a moderate reflectivity in the range of about 25–75 percent. In such other embodiment, insert 1216 can be, for example, a partially "silvered" mirror, the ribbed or textured reflectors of FIGS. 9 and 10, or an optical modulator. If textured reflectors are used, then frame 1114 should be disposed orthogonally to optical axis 8-8, rather than at an oblique angle thereto.

Figure 13:
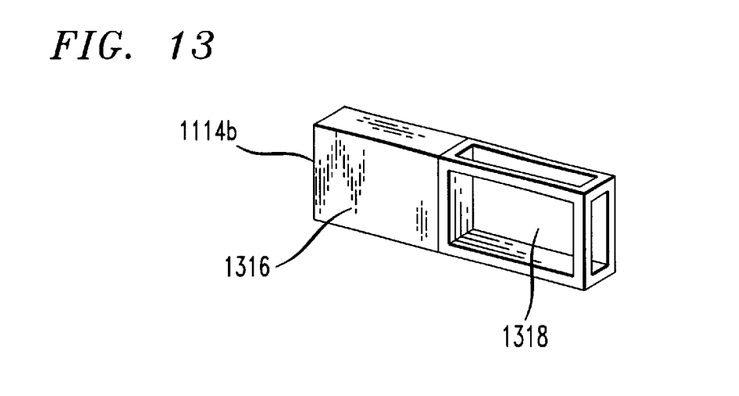
FIG. 13 depicts an embodiment of a frame for use with the movable sampler depicted in FIG. 11.

FIG. 13 depicts a second specific illustrative implementation of frame 1114 of FIG. 11. Rather than using inserts like frame 1114a, frame 1114b implements reflective portion 1116 by providing a reflective surface 1316 and implements substantially transmissive portion 1118 by providing an open region 1318.

In a further embodiment of the present invention, rather than reflecting at least a portion of the launched light to a photodetector and associated equipment for assessing output power drift, the output power drift is assessed based upon the launched light absorbed by the sampler. More particularly, in one embodiment, a temperature differential in the sampler is measured, such temperature differential resulting from the absorption of a known quantity of launched light. Such measurement can be accomplished, for example, by attaching a thermocouple to the sampler. In another embodiment, output power drift is assessed by measuring a change in the electrical conductivity of the sampler based on its absorption of a known quantity of launched light (i.e., photoconductivity). In a further embodiment, a resistivity change in the sampler is measured as a result of a temperature change in the sampler due to the absorption of a known quantity of launched light. Such measurement can be accomplished, for example, by a piezo resistor, a resistor or a piezo electric. In yet another embodiment, a change in the size of the sampler is measured based on a known amount of launched light absorbed thereby.

Figure 14:
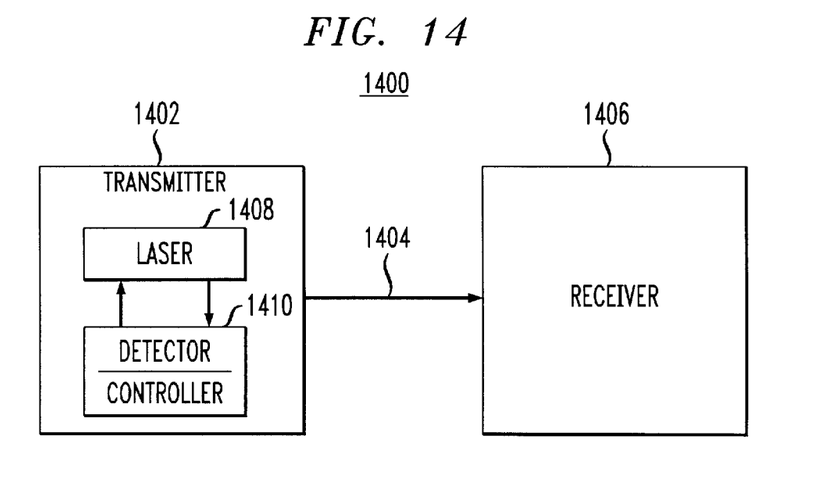
FIG. 14 depicts an optical fiber communications system including the fiber laser of FIG. 4.

FIG. 14 depicts, via a simplified block diagram, optical fiber communications system 1400 in accordance with an illustrative embodiment of the present invention. Communications system 1400 includes a transmitter 1402 optically connected to a receiver 1406 via waveguide 1404. Waveguide 1404 may be, for example, a plurality of optical fibers. An information source, not shown, provides an information signal, typically in the form of an electrical signal, to transmitter 1402. More particularly, the electrical signal is provided to an electrical stage (not shown) that drives an optical source, such as fiber laser 1408, to modulate a lightwave carrier. Fiber laser 1408 includes a light pump (not shown), such as a diode array, the operation of which is monitored and controlled by apparatus 1410 according to the present teachings. Apparatus 1410 includes a sampler and associated devices (not shown) that have been previously described. The modulated carrier is delivered, via waveguide 1404, to receiver 1406. Receiver 1406 includes an optical detector (not shown) that drives a further electrical stage (not shown) for demodulating the carrier and providing an estimate of the original information signal.

It is to be understood that the embodiments described herein are merely illustrative of the many possible specific arrangements that can be devised in application of the principles of the invention. Other arrangements can be devised in accordance with these principles by those of ordinary skill in the art without departing from the scope and spirit of the invention. It is therefore intended that such other arrangements be included within the scope of the following claims and their equivalents.

We claim:

1. An article comprising:
a waveguide for delivering an output from a light pump to a laser cavity, said waveguide having a gap between first and second sections;
a sampler for redirecting a first portion of said output away from said laser cavity, wherein:
said sampler engages said first portion of said output between said first and second sections;
said sampler comprises a surface that has variable reflectivity at said surface is linked to an actuator that moves said reflective surface into and out of the gap between said first and second sections; and
a photodetector that receives said first portion of said output and converts it to a first electrical signal representative of output power of said light pump.

2. The article of claim 1 wherein said surface is disposed at an oblique angle to an optical path defined by said waveguide.

3. The article of claim 1 wherein said surface is aligned with an axis that is perpendicular to an optical path defined by said waveguide, said surface comprising textured reflectors, said reflectors having a first surface that is oriented at an oblique angle to said optical path.

4. The article of claim 1 wherein said waveguide is a multimode waveguide.

5. The article of claim 1 wherein said surface comprises a fixed-reflectivity device.

6. The article of claim 1 wherein said surface comprises an optical modulator.

7. The article of claim 1 further comprising a processor operable:
to receive said first electrical signal;
to compare said first electrical signal to a second electrical signal that is representative of a desired power output of said first portion of said output; and
to determine a difference between said first electrical signal and said second electrical signal.

8. The article of claim 1 wherein said article is an optical fiber communications system having a transmitter optically connected to a receiver, wherein said transmitter comprises said light pump, said laser cavity, said waveguide, said sampler and said photodetector.

9. The article of claim 5 wherein said fixed-reflectivity device comprises a reflective surface, said reflective surface having a coating selected from the group consisting of metal, dielectric material and a polymer multi-layer.

10. The article of claim 5 further comprising a controllable current source that is electrically connected to said light pump and is operable to deliver current to said light pump under the control of said control signal.

11. The article of claim 7 wherein said processor is further operable to generate a control signal based on said determined difference.

* * * * *